United States Patent

Boardman et al.

[11] Patent Number: 5,920,013
[45] Date of Patent: Jul. 6, 1999

[54] SILICON MICROMACHINE WITH SACRIFICIAL PEDESTAL

[75] Inventors: William John Boardman; John Crumlin; John Ralph Lindsey; Paul Thomas Carson; Judd Steven Carper; John Ames; Paul Elwin Stevenson, all of Colorado Springs, Colo.

[73] Assignee: Ford Motor Company, Dearborn, Mich.

[21] Appl. No.: 08/797,376

[22] Filed: Feb. 7, 1997

[51] Int. Cl.⁶ .................................................. G01P 15/125
[52] U.S. Cl. .......................................... 73/514.32; 361/280
[58] Field of Search ........................ 73/514.32; 361/280, 361/283.1, 283.2; 156/272.2, 273.1; 29/25.41; 428/428

[56] References Cited

U.S. PATENT DOCUMENTS

| | | | |
|---|---|---|---|
| 4,384,899 | 5/1983 | Myers ..................................... | 156/273.1 |
| 4,483,194 | 11/1984 | Rudolf ..................................... | 73/517 |
| 4,598,585 | 7/1986 | Boxenhorn .............................. | 73/505 |
| 4,736,629 | 4/1988 | Cole ........................................ | 73/517 |
| 5,220,835 | 6/1993 | Stephan ................................. | 73/517 R |
| 5,404,749 | 4/1995 | Spangler ............................... | 73/517 R |
| 5,446,616 | 8/1995 | Warren ................................ | 73/514.32 |
| 5,488,864 | 2/1996 | Stephan ................................ | 73/514.32 |

*Primary Examiner*—John E. Chapman
*Attorney, Agent, or Firm*—Mark L. Mollon; Roger L. May

[57] ABSTRACT

A protective coating is utilized to protect the silicon during a wet chemical etch step in the process of making a micromachine, thereby preventing the formation of etched holes or pits in the micromachine. In another embodiment, silicon sacrificial pedestals are used to eliminate or greatly reduces the electrical potential difference between metal on the glass substrate and the silicon, thereby eliminating arcing and the resulting damage to silicon and metal. These pedestals may be removed after the anodic bond.

8 Claims, 3 Drawing Sheets

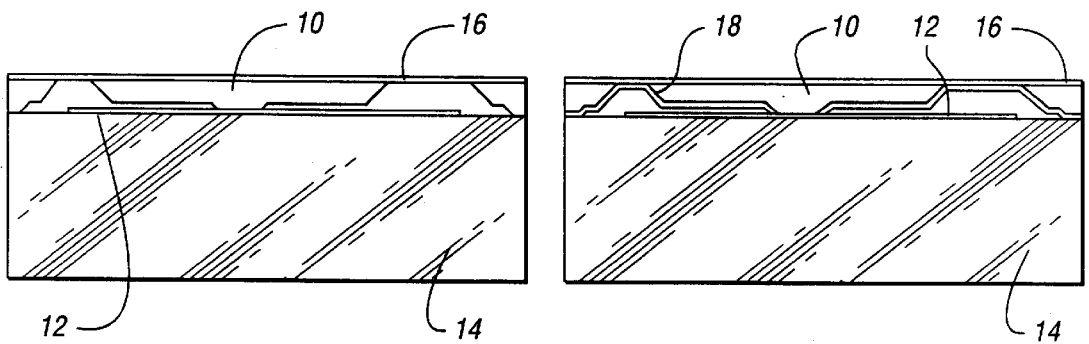
Fig. 1 (PRIOR ART)
Fig. 2
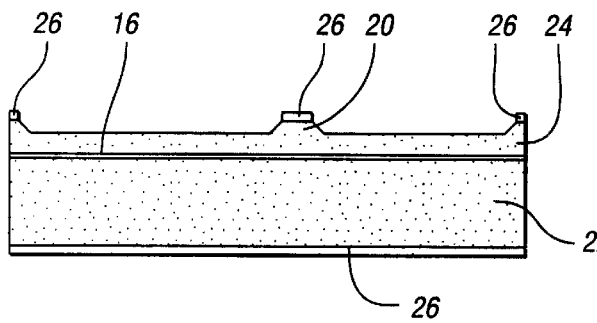
Fig. 3
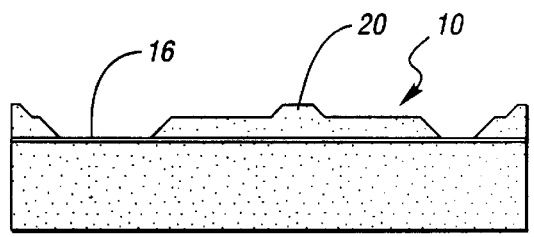
Fig. 4
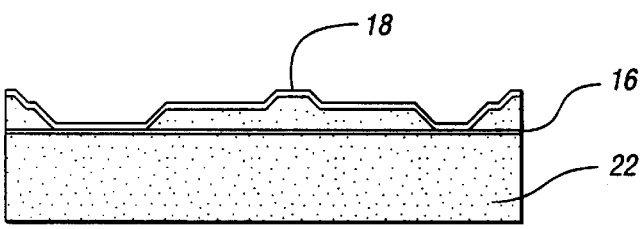
Fig. 5

SILICON MICROMACHINE WITH SACRIFICIAL PEDESTAL

TECHNICAL FIELD

This invention relates to silicon micromachines and, more particularly, to methods of preventing damage thereto during wet chemical silicon etch and anodic bond.

BACKGROUND ART

Prior art methods of making silicon micromachines involve a step of anodic bonding of micromachined silicon to a glass or pyrex substrate that contains metalization. Anodic bonding requires applying a high voltage to the glass, which can result in dielectric breakdown of the gas between the silicon and metal (arcing), and damage to both the silicon and the metal. Such prior art methods also use a wet chemical silicon release etch (e.g., mixtures of acetic, nitric and hydrofluoric acid). This type of silicon etch is known to etch metal contaminated silicon or damaged silicon (e.g., by anodic bonding), at a different etch rate than silicon that is not damaged nor contaminated. This results in pits or holes being etched in the micromachine that can result in failure of the micromachine by fracturing.

SUMMARY OF THE INVENTION

In accordance with the present invention, a protective coating is utilized to protect the silicon during the wet chemical silicon etch, thereby preventing the formation of etched holes or pits in the micromachine.

An additional feature of the present invention is the prevention of dielectric breakdown of the air (or other gas) gap between the silicon micromachine and the glass or pyrex wafer to which it is anodically bonded, thereby preventing damage to the silicon. This is accomplished in the present invention by the use of silicon pedestals that eliminate or greatly reduce the electrical potential difference between metal on the glass substrate and the silicon, thereby eliminating arcing and the resulting damage to silicon and metal. These pedestals may be removed after the anodic bond. Preferably, the protective coating and silicon pedestals are both employed to protect against both arcing and etched holes.

BRIEF DESCRIPTION OF THE DRAWINGS

A more complete understanding of the present invention may be had from the following detailed description which should be read in conjunction with the drawings in which:

FIG. 1 is a cross-sectional view of a prior art micromachined silicon element;

FIG. 2 is a cross-sectional view of a micromachined silicon element of the present invention with a protective coating covering the silicon;

FIGS. 3–9 show various process steps in the formation of the element of the present invention;

DETAILED DESCRIPTION OF PREFERRED EMBODIMENT

Figure 6:
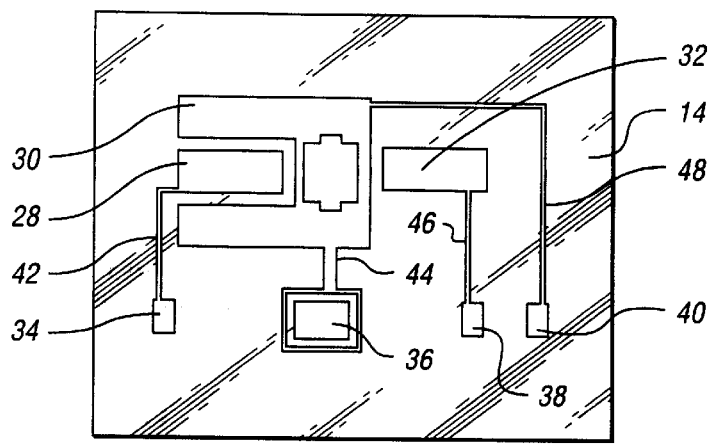

Referring now to the drawings and initially to FIG. 1, a side view of a prior art micromachined silicon element is shown such as the capacitive-type torsion beam accelerometer sensor disclosed in U.S. Pat. No. 5,488,864 assigned to the assignee of the present invention and incorporated herein by reference. The micromachined silicon element, generally indicated at 10, includes floating metal capacitor plates or other types of metalization 12 on a glass or pyrex substrate 14, and an etch stop silicon layer 16. A large potential difference of from 100V–1000V exist between the metal capacitor plates 12 and the silicon element 10 during the anodic bond process used to attach the silicon element to the glass substrate.

The etch stop layer 16 (usually heavily doped p-type silicon) is removed after anodic bond in a wet silicon etch solution (such as a mixture of acetic, nitric and hydrofluoric acid) to release the silicon element 10. This silicon etch solution will "decorate" any damage to the silicon caused by arcing during the anodic bond, or by other mechanisms, because the damaged silicon will etch differently than undamaged silicon. It will also decorate the areas of the silicon crystal lattice that have been contaminated by foreign materials such as metals.

Referring now to FIG. 2, a side view of an embodiment of the present invention is shown. Both FIGS. 1 and 2 are shown in a process state just prior to the wet silicon release etch. A protective coating 18 has been added to cover the silicon element 10 during the wet silicon etch, which removes the etch stop layer and releases the element. This coating 18 will protect the element 10 from being attacked during the wet silicon release etch, preventing not only the formation of etch pits or holes at locations where the silicon crystal has been damaged or contaminated but also preventing any variation in the shape of the element beams or other critical dimensions that could affect the mechanical function of the device. Of course, formation of etched holes in the element will adversely affect the reliability of the device, causing fractures during drop or random vibration tests. Following the wet silicon release etch, the coating 18 may be removed (e.g., a $SiO_2$ layer could be removed with hydrofluoric acid); or if it does not affect the device function, it can be left in place. Another suitable coating is silicon nitride; indeed, any protective coating that is impervious to the etch chemical may be used.

An example of a process flow for this embodiment of the invention will now be described with reference to FIGS. 3–8. The structural design of this accelerometer is described in the aforementioned U.S. Pat. No. 5,488,864. The accelerometer of the present invention does not utilize a boron doped element as suggested in the patent.

The process of forming a pedestal 20 starts with an n-type <100> silicon wafer 22, with a P+ etch stop layer 16 (approximately 1E20 atoms/cm3) and an n-type epitaxial silicon layer 24 (approximately 2E16 atoms/cm3, phosphorous). The accelerometer element is formed in the top layer of n-type epitaxial silicon using a "dissolved wafer" process. A silicon nitride layer 26 is deposited, a photolithography mask step is performed, then the nitride is etched followed by an anisotropic wet chemical etch of the silicon, to form the pedestal 20 as shown in FIG. 3.

The formation of the silicon element 10 is initiated by etching off the pedestal nitride layer 26. Next, a second nitride deposition and photolithography step is performed. The nitride is etched, the photoresist stripped and another anisotropic wet etch step is performed which defines the shape of the element 10. The remaining nitride is then removed as shown in FIG. 4.

A silicon dioxide layer 18 is grown on the silicon as shown in FIG. 5. A pyrex metalization step is performed as depicted in FIG. 6 that includes a photolithography step, followed by metal evaporation, and resist liftoff, to form metal capacitor plates 28, 30, and 32, bond pads 34–40 and interconnects 42–48.

Figure 7:
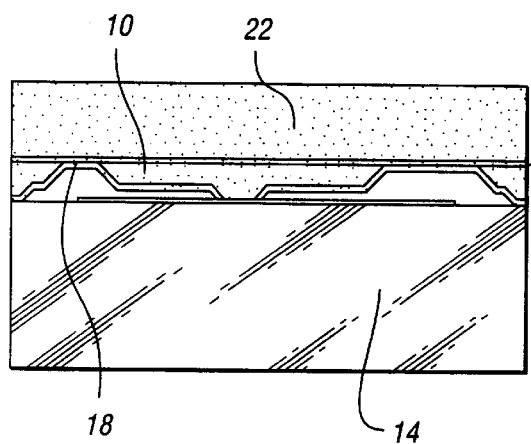

The anodic bond process step, depicted in FIG. 7, attaches the silicon substrate 22 to the glass substrate 14 using high voltage (100v–1000v) and elevated temperature (250° C.–500° C.).

Figure 8:
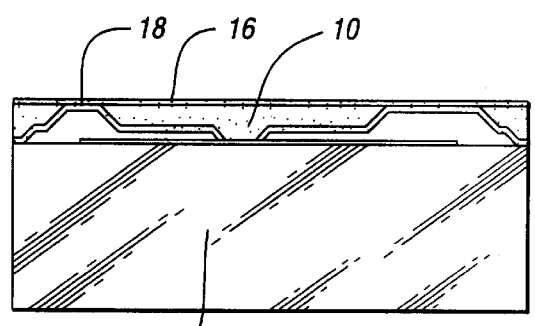

As shown in FIG. 8, a wet chemical etch such as mixtures of KOH and alcohol, is used that is selective to high boron concentration (greater than approximately 5E19 boron atoms/cm3). This etch removes the bulk of the silicon substrate 22, leaving the p+ etch stop membrane 16 over the n-type element 10.

Figure 9:
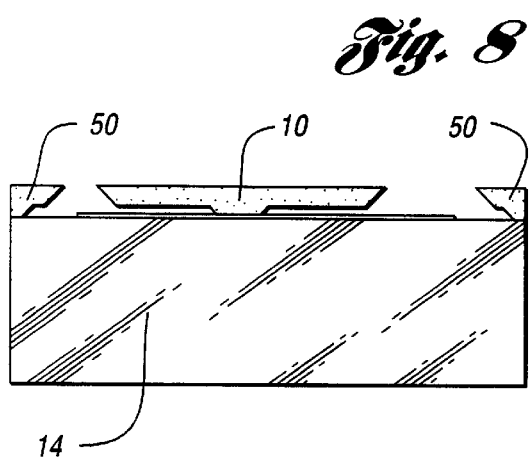

FIG. 9 shows the structure after an isotropic wet release etch that removes the P+ membrane 16 and releases the element 10. This release etch is typically a mixture of nitric and hydrofluoric acid with either acetic acid or water. The invention provides protection from this etch with the oxide coating 18, as previously described. It also prevents electrochemical reaction between the metalization and the silicon during the wet etch. Following this etch, the oxide coating 18 may be removed using hydrofluoric acid. An oxide layer remains under the pedestal so that the device appears as shown in FIG. 9. Although only a single element 10 is depicted, it will be understood that a plurality of elements are located on the substrate 14. A silicon wall (or dike) 50 separates the individual elements on the substrate 14.

Figure 10:
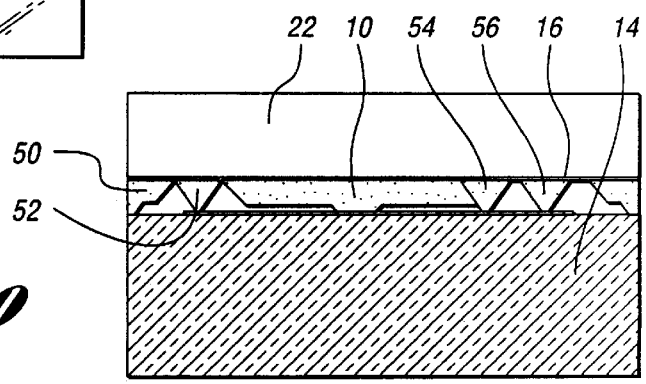
FIG. 10 is a side view of a second embodiment of the present invention that is particularly effective in preventing arcing damage to silicon micromachines during anodic bonding.
Figure 11:
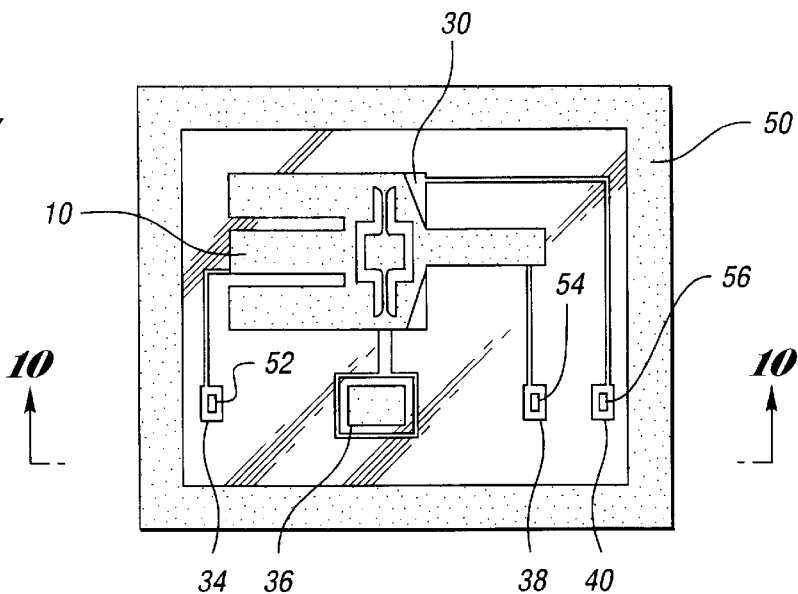
FIG. 11 is a top view of the embodiment shown in FIG. 10.

Referring now to FIGS. 10 and 11, a second embodiment of the invention is shown, with the metal bond pads 34, 38 and 40 contacting sacrificial silicon pedestals 52, 54, and 56, connected to the element 10 so that the silicon and the metalization is at the same potential during the high voltage anodic bond. FIG. 10 show the invention at the anodic bond process stage as described earlier for FIG. 7. The sacrificial pedestals 52, 54 and 56 are removed after anodic bond. This embodiment of the invention eliminates any damage to the metalization or the silicon element 10, due to dielectric breakdown (arcing) of the air (or other gas) gap, by bringing the metalization and the element to the same potential. Any method of contacting or bringing into proximity the metalization and the silicon so that the potential difference between the silicon and the metal is reduced below the breakdown voltage of the air gap will provide this protection.

Figure 12:
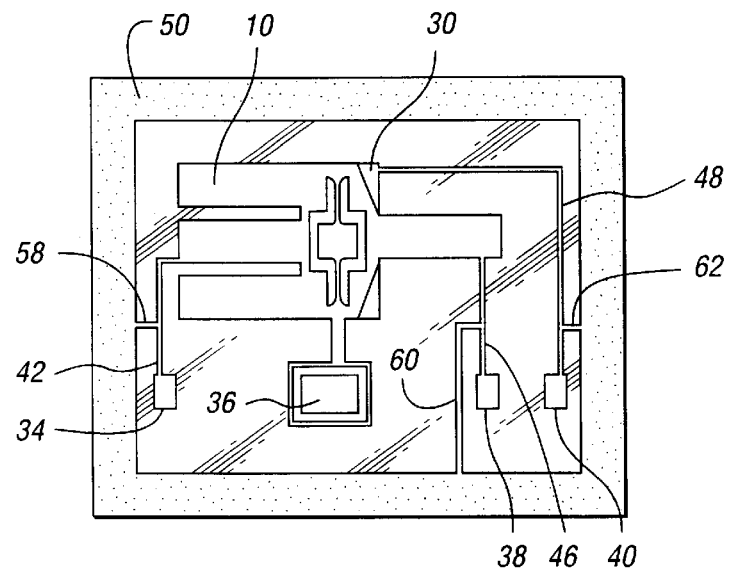
FIG. 12 is an extension of the embodiment of FIGS. 3–9 with metal lines brought out to the silicon dike to prevent arcing damage.

An alternative design is shown in FIG. 12, with metal lines 58, 60, and 62, brought out to the silicon dike 50 from the interconnects 42, 46, and 48, respectively. These lines are removed after anodic bond.

Figure 13:
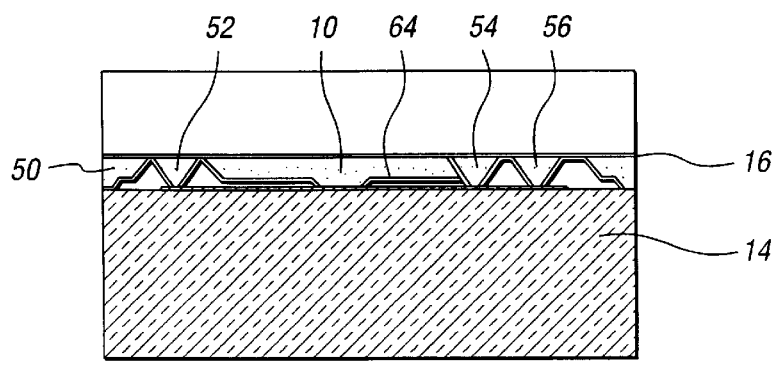
FIG. 13 is a preferred embodiment of the invention protecting the element from both arcing damage and wet etch damage.

Referring now to FIG. 13, a preferred method of contacting or bringing the silicon pedestals 52, 54, and 56 into proximity with the metal bond pads 34, 38, and 40, is shown. To prevent arcing damage to the element 10, a thin insulating layer 64 covers the silicon (e.g. $SiO_2$) so that the pedestals 52, 54, and 56 do not directly contact the metal bond pads 34, 38, and 40. The oxide should be thin enough so that any dielectric breakdown occurs to the pedestals 52, 54 and 56 through the insulator and not through the air gap to the delicate silicon element 10. Also, if the oxide is thin enough to allow strong capacitive coupling between the silicon pedestals and the metal, the potential difference between the element and the metal will be reduced below the breakdown voltage of the gap. This preferred embodiment will also provide protection from silicon wet etch hole defects as described earlier.

While the best mode for carrying out the present invention has been described in detail, those familiar with the art to which this invention relates will recognize various alternative designs and embodiments for practicing the invention as defined by the following claims.

What is claimed is:

1. A silicon micromachine comprising:

a substantially planar substrate;

a silicon element including an integral pedestal support portion;

at least one metal conductive pattern mounted on said substrate; and at least one silicon sacrificial pedestal extending from and integral with said element for reducing the potential difference between said pattern and said element during anodic bonding of said pedestal support portion to said substrate.

2. The silicon micromachine of claim 1 wherein said at least one silicon sacrificial pedestal is in proximity with said pattern.

3. The micromachine of claim 1 further comprising a protective coating between said substrate and said pedestal support portion of said element and said at least one sacrificial pedestal.

4. The micromachine of claim 1 further comprising an insulating layer separating said at least one silicon sacrificial pedestal from direct contact with said pattern during anodic bonding.

5. A silicon micromachine comprising:

a substantially planar substrate;

a silicon element including an integral pedestal support portion;

at least one metal conductive pattern mounted on said substrate;

said pattern including first and second metal capacitor plates;

first and second silicon sacrificial pedestals integral with said element and extending from said element toward said first and second metal capacitor plates, respectively to reduce the potential difference between said element and said plates during anodic bonding of said pedestal support portion to said substrate;

a silicon etch stop layer contacting one surface of each of said pedestals and said element.

6. The micromachine of claim 5 further comprising a protective coating extending between said substrate and said pedestal support portion of said element and said sacrificial pedestals.

7. The micromachine of claim 5 wherein said silicon sacrificial pedestals are in proximity with said pattern during anodic bonding.

8. The micromachine of claim 5 wherein said silicon sacrificial pedestals are separated from said pattern during anodic bonding by an insulating layer.

* * * * *